(12) United States Patent
Sakano et al.

(10) Patent No.: US 12,408,302 B2
(45) Date of Patent: Sep. 2, 2025

(54) AIR CONDITIONER

(71) Applicant: BROTHER KOGYO KABUSHIKI KAISHA, Nagoya (JP)

(72) Inventors: Yuji Sakano, Toyota (JP); Shigeki Yoshida, Toyoake (JP); Masashi Ichihashi, Mizuho (JP); Naokatsu Osawa, Nagoya (JP); Manabu Shirai, Nagoya (JP); Ryuta Iijima, Nagoya (JP)

(73) Assignee: BROTHER KOGYO KABUSHIKI KAISHA, Nagoya (JP)

( * ) Notice: Subject to any disclaimer, the term of this patent is extended or adjusted under 35 U.S.C. 154(b) by 907 days.

(21) Appl. No.: 17/573,463

(22) Filed: Jan. 11, 2022

(65) Prior Publication Data

US 2022/0132699 A1 Apr. 28, 2022

Related U.S. Application Data

(63) Continuation of application No. PCT/JP2020/002282, filed on Jan. 23, 2020.

(30) Foreign Application Priority Data

Jul. 18, 2019 (JP) .................................. 2019-133142

(51) Int. Cl.
*F24F 1/00* (2019.01)
*F24F 1/24* (2011.01)
(Continued)

(52) U.S. Cl.
CPC ............. *H05K 7/2039* (2013.01); *F24F 1/24* (2013.01); *B60H 2001/00614* (2013.01)

(58) Field of Classification Search
CPC .......................... B60H 2001/00614; F24F 1/24
See application file for complete search history.

(56) References Cited

U.S. PATENT DOCUMENTS 5,669,813 A * 9/1997 Jairazbhoy ......... B60H 1/00271
361/645
2005/0117000 A1 6/2005 Shimizu
(Continued)

FOREIGN PATENT DOCUMENTS

CN 1621234 A 6/2005
CN 102003759 A 4/2011
(Continued)

OTHER PUBLICATIONS

Apr. 13, 2021 Office Action issued in Japanese Patent Application No. 2019-133142.
(Continued)

*Primary Examiner* — Brian M King
(74) *Attorney, Agent, or Firm* — Oliff PLC

(57) ABSTRACT

An air conditioner includes an inlet; a suction channel through which air sucked from the inlet flows; a spray unit configured to spray water to be vaporized; a first channel through which first air to be cooled by heat of vaporization of water sprayed from the spray unit flows; a heat exchanger configured to exchange heat between the first air and the air flowing through the suction channel to cool the air flowing through the suction channel; wall body defining the first channel located downstream of the heat exchanger in a flow direction of the first air; and an electric device configured to generate heat with power consumption by the air conditioner. The electric device is thermally connected to the wall body.

8 Claims, 5 Drawing Sheets

(51) Int. Cl.
*H05K 7/20* (2006.01)
*B60H 1/00* (2006.01)

(56) References Cited

U.S. PATENT DOCUMENTS

| | | |
|---|---|---|
| 2015/0159889 A1 | 6/2015 | Ha et al. |
| 2019/0107332 A1 | 4/2019 | Rede et al. |
| 2020/0182491 A1 | 6/2020 | Kurokawa et al. |

FOREIGN PATENT DOCUMENTS

| | | | | |
|---|---|---|---|---|
| CN | 104697045 A | | 6/2015 | |
| CN | 107940609 A | * | 4/2018 | |
| GB | 2579476 A | | 6/2020 | |
| JP | S51-060160 U | | 5/1976 | |
| JP | S56-61825 U | | 5/1981 | |
| JP | H07-89330 A | | 4/1995 | |
| JP | H10-122601 A | | 5/1998 | |
| JP | 2004093017 A | * | 3/2004 | ............ F24F 3/1423 |
| JP | 2005-282905 A | | 10/2005 | |
| JP | 2006-105542 A | | 4/2006 | |
| JP | 2009-192145 A | | 8/2009 | |
| JP | 2010-133618 A | | 6/2010 | |
| JP | 5033518 B2 | | 9/2012 | |
| JP | 2013-087956 A | | 5/2013 | |
| JP | 2013-096673 A | | 5/2013 | |
| JP | 2014-092338 A | | 5/2014 | |
| JP | 2014-149134 A | | 8/2014 | |
| JP | 2016-050702 A | | 4/2016 | |
| JP | 2016-90136 A | | 5/2016 | |
| JP | 2019-32141 A | | 2/2019 | |
| WO | 2019/043771 A1 | | 3/2019 | |

OTHER PUBLICATIONS

Mar. 3, 2020 International Search Report issued in International Patent Application No. PCT/JP2020/002282.
Mar. 3, 2020 Written Opinion of the International Searching Authority issued in Patent Application No. PCT/JP2020/002282.
Jan. 18, 2022 International Preliminary Report on Patentability issued in Patent Application No. PCT/JP2020/002282.
Oct. 20, 2022 Office Action issued in Chinese Patent Application No. 202080051195.6.
May 23, 2023 Office Action Issued in Japanese Patent Application No. 2021-136107.
Jun. 6, 2023 Extended European Search Report Issued in European Patent Application No. 20839809.9.

* cited by examiner

AIR CONDITIONER

CROSS-REFERENCE TO RELATED APPLICATION

This is a continuation application of International Application No. PCT/JP2020/002282 filed on Jan. 23, 2020 which claims priority from Japanese Patent Application No. 2019-133142 filed on Jul. 18, 2019. The entire contents of the earlier applications are incorporated herein by reference.

TECHNICAL FIELD

The disclosure relates to an air conditioner.

BACKGROUND

A known air conditioner of an evaporative cooling type takes in air in a room and blows air cooled by lowering the ambient temperature using the vaporization heat of water into the room. The known air conditioner (or evaporative cooler) includes a blowing means disposed in a casing, a first channel which connects an inlet and a first outlet and guides an air flow generated by the blowing means to the first outlet, a second channel which connects the inlet and a second outlet and guides an air flow generated by the blowing means to the second outlet, a vaporizing means which is disposed in the second channel and cools the air flowing in the second channel using the heat of vaporization of water, and a heat exchanger which performs heat exchange between the air flow cooled by the vaporizing means in the second channel and the air flow flowing in the first channel. In the second channel provided with the vaporization means, air whose absolute humidity has increased due to atomized water (i.e., unevaporated spray water) and vaporized water (i.e., evaporated spray water) sprayed by the vaporization means flows downstream of the vaporization means. This air with increased humidity is blown out as exhaust air from the second outlet which is an outlet of the second channel. The air cooled through the heat exchanger and flowing through the first channel is blown out from the first outlet as supply air to a space to be air-conditioned.

SUMMARY

According to an aspect of the disclosure, an air conditioner includes an inlet; a suction channel through which air sucked from the inlet flows; a spray unit configured to spray water to be vaporized; a first channel through which first air to be cooled by heat of vaporization of water sprayed from the spray unit flows; a heat exchanger configured to exchange heat between the first air and the air flowing through the suction channel to cool the air flowing through the suction channel; a wall body defining the first channel located downstream of the heat exchanger in a flow direction of the first air; and an electric device configured to generate heat with power consumption by the air conditioner. The electric device is thermally connected to the wall body.

The air conditioner can efficiently cool the electric device that generates heat with power consumption.

DETAILED DESCRIPTION

In a case where the above-described known air conditioner includes an electric device, such as a blower, which generates heat with power consumption, heat generation is not taken into consideration in the heat generation.

The disclosure has been made in view of the above circumstances, and an object thereof is to provide an air conditioner including an electric device that generates heat with power consumption and being configured to efficiently cool the electric device.

Figure 1:
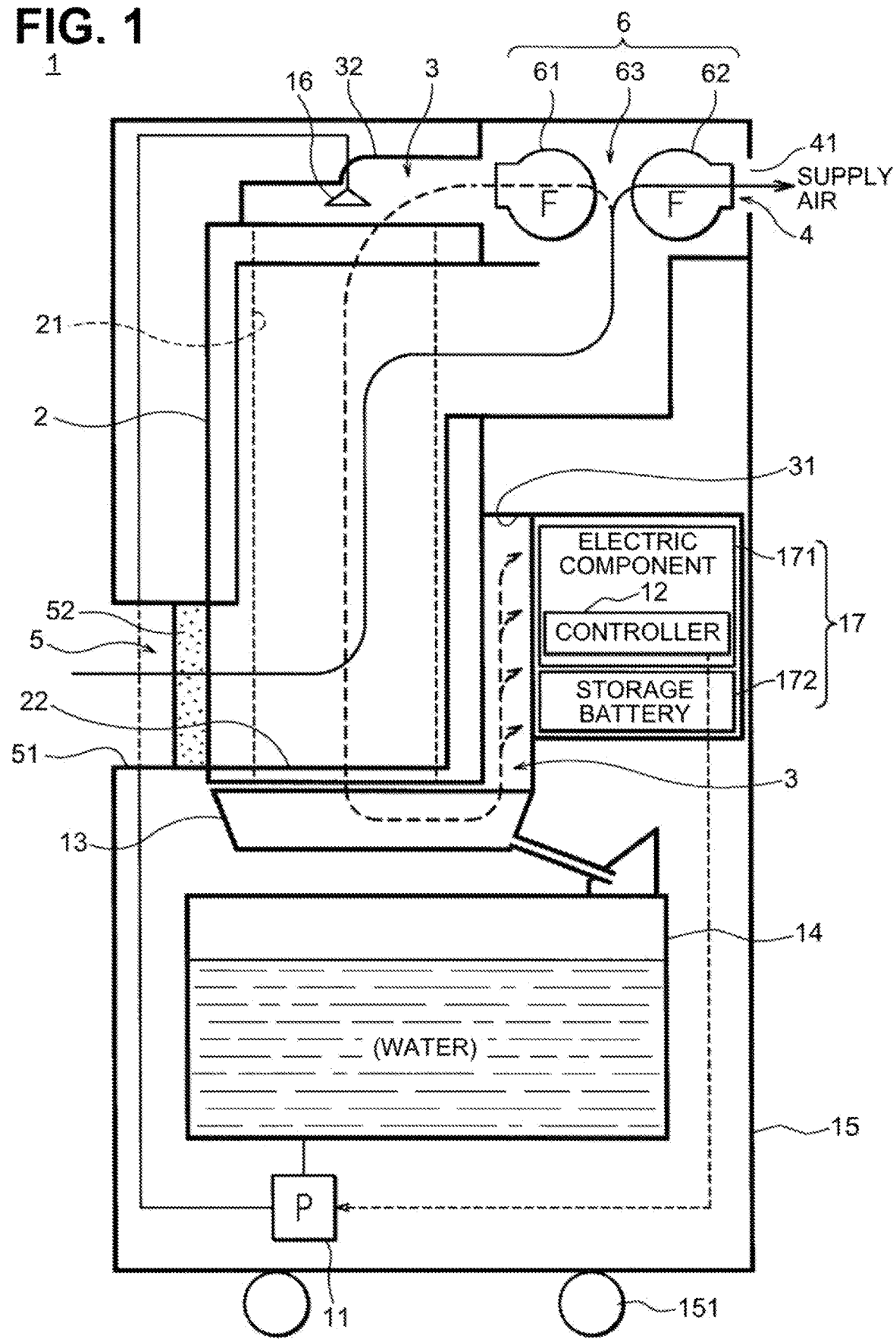
FIG. 1 is a schematic sectional view of an example configuration of an air conditioner according to a first embodiment.
Figure 2:
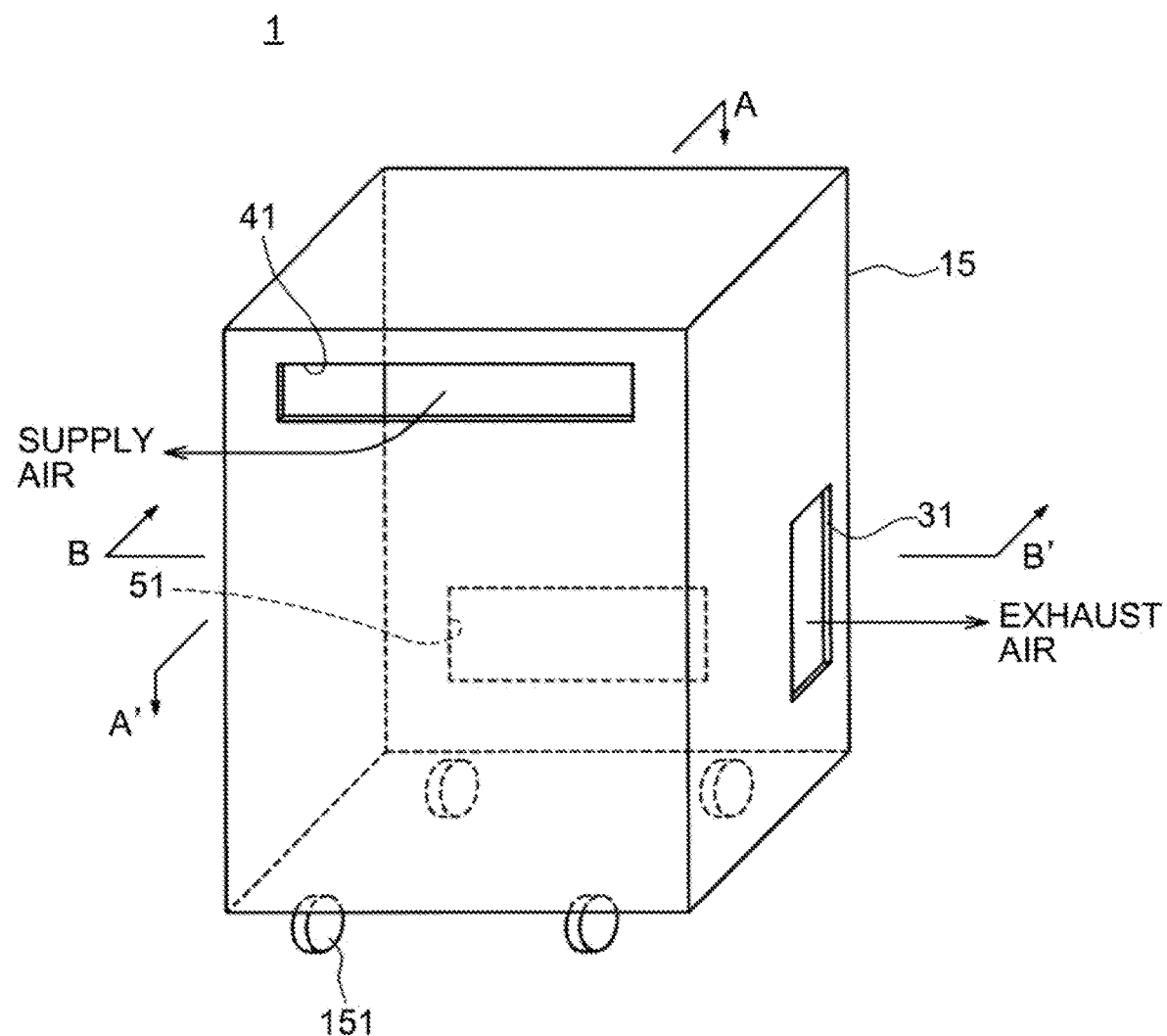
FIG. 2 is an external perspective view of the air conditioner.

A first embodiment will be described below with reference to the drawings. FIG. 1 is a schematic sectional view of an example configuration of an air conditioner 1 according to the first embodiment. FIG. 2 is a perspective view illustrating the appearance of the air conditioner 1. The air conditioner 1 includes a box-shaped housing 15 and casters 151 at a bottom portion of the housing 15, and is placed on a floor surface of a space to be air-conditioned such as a factory. The placement state of the air conditioner 1 illustrated in FIG. 1 is illustrated as a normal use state of the air conditioner 1, with up, down, left, and right directions. FIG. 1 schematically illustrate a cross section taken along line A-A' in FIG. 2 and viewed from the left side in FIG. 2.

The air conditioner 1 includes a sensible heat exchanger 2 and a spray unit 16, and uses the heat of vaporization of water sprayed from the spray unit 16 to lower an ambient temperature and provide cooling for the space to be air-conditioned. For example, the air conditioner 1 is of an indirect evaporate cooling type.

The housing 15 of the air conditioner 1 is provided with an inlet 51 for taking in air in the space to be air-conditioned, a first outlet 31 for discharging air that is cooled directly by the heat of vaporization of sprayed water, and a second outlet 41 for discharging air that is cooled by heat exchange with first air through the sensible heat exchanger 2 to provide cooling for the space to be air conditioned. The first air is synonymous with exhaust air, and second air is synonymous with supply air. The first outlet 31 corresponds to an exhaust air outlet, and the second outlet 41 corresponds to a supply air outlet.

The air conditioner 1 includes a first channel 3 through which first air to be cooled directly by the heat of vaporization of water sprayed from the spray unit 16 flows, and a suction channel 5 through which air sucked from the inlet 51 and to be cooled by heat exchange with the cooled first air flows. The air conditioner 1 includes a branch mechanism 6 for dividing the suction channel 5 into the first channel 3 and a second channel 4. The branch mechanism 6 includes a first fan 61 and a second fan 62 that function as air blowers, and divides suction air that flows in the suction channel 5 into first air that flows in the first channel 3 and second air that flows in the second channel 4. Details of the branch mechanism 6 will be described later.

The suction channel 5 is a channel located between the inlet 51 and the branch mechanism 6, and includes a suction path 22 of the sensible heat exchanger 2 described later. The suction channel 5 adjacent to the inlet 51 is provided with a filter 52 having, for example, polyester or olefin fibers. The filter 52 collects dust in air sucked from the inlet 51 to prevent the dust from entering the suction path 22 of the sensible heat exchanger 2.

The first channel 3 is a channel located between the branch mechanism 6 and the first outlet 31, and includes a first path 21 of the sensible heat exchanger 2 described later. The second channel 4 is a channel located between the branch mechanism 6 and the second outlet 41.

The sensible heat exchanger 2 includes the suction path 22 that defines at least a portion of the suction channel 5, and the first path 21 that defines at least a portion of the first channel 3. The sensible heat exchanger 2 may include a box-shaped case made of, for example, metal such as aluminum or resin and covered by heat insulating material to limit heat exchange between air around the sensible heat exchanger 2 and first air or suction air that flows inside of the sensible heat exchanger 2.

The first path 21 and the suction channel 5 formed in the sensible heat exchanger 2 are defined by a plurality of metal plates disposed in parallel and each having, for example, a hollow structure in which first air or suction air flows. The metal plates having a hollow structure may be replaced with, for example, a plurality of fins or flat tubes. For example, the efficiency of sensible heat exchange can be improved by forming the plates from a metal having high heat conductivity, such as aluminum, copper, or the like, or an alloy of these as main ingredients. These metal plates having a hollow structure define a plurality of first paths 21 and a plurality of suction paths 22.

In a flow direction of suction air, an inlet of an suction path 22 is provided in a lower portion of a left side surface of the sensible heat exchanger 2, and an outlet of the suction path 22 is provided in an upper portion of a right side surface of the sensible heat exchanger 2. The suction path 22 of the sensible heat exchanger 2 communicates from the lower left inlet to the upper right outlet, and is thus shaped like a crank. In FIG. 2, the suction path 22 has an inverted Z shape.

In a flow direction of the first air, an inlet of a first path 21 is provided in an upper portion of the sensible heat exchanger 2, and an outlet of the first path 21 is provided in a lower portion of the sensible heat exchanger 2. The first path 21 of the sensible heat exchanger 2 is thus shaped like a straight line from up to down.

In the sensible heat exchanger 2, the first air flowing through the first path 21 flows from up to down, and suction air flowing through the suction path 22 flows from down to up. Flows of the first air and the suction air move in opposite directions to each other, forming countercurrent flows.

The spray unit 16 is disposed above the inlet of the first path 21 of the sensible heat exchanger 2. The first air flowing through the first path 21 is cooled by the heat of vaporization of atomized water sprayed from the spray unit 16. The sensible heat exchanger 2 exchanges heat between the suction air flowing through the suction path 22 and the first air flowing through the first path 21. The suction air is thus cooled by the first air. The flows of first air and suction air form countercurrent flows, thus improving the heat exchange rate in the sensible heat exchanger 2.

Suction air sucked from the space to be air-conditioned through the inlet 51 passes through the filter 52 and then flows into the suction path 22 of the sensible heat exchanger 2. The suction air having flown into the suction path 22 of the sensible heat exchanger 2 is cooled through the sensible heat exchanger 2 by heat exchange with first air. The suction air cooled and having passed through the suction path 22 of the sensible heat exchanger 2 flows into a branch chamber 63 of the branch mechanism 6 located downstream of the suction path 22.

The suction air having flown into the branch mechanism 6 is divided into first air to flow through the first channel 3 and second air to flow through the second channel 4. Second air flowing through the second channel 4 is blown from the second outlet 41 (e.g., supply air outlet) into the space to be air-conditioned, thereby cooling the space to be air-conditioned. The first air flowing through the first channel 3 flows into the first path 21 of the sensible heat exchanger 2.

The first air having flown into the first path 21 is further cooled by the heat of vaporization of water sprayed from the spray unit 16 as described above. The first air flowing through the first path 21 exchanges heat with the suction air flowing through the suction path 22 through the sensible heat exchanger 2, whereby the suction air is cooled. The first air is divided from the suction air and can be thereby cooled substantially in two stages, and thus a temperature of first air can be efficiently lowered. That is, the first air is cooled in two stages, whereby the suction air can be cooled to a temperature lower than that of the suction air cooled directly by the heat of vaporization only.

The second air blown in the space to be air-conditioned is obtained by dividing the suction air, and the suction air is cooled by the first air through the sensible heat exchanger 2. Since the first air is cooled in two stages as described above and has a lower temperature, the suction air can be efficiently cooled by the first air, and the second air obtained by dividing the cooled suction air can be blown out and supplied to the space to be air-conditioned.

The first air that has passed through the first path 21 of the sensible heat exchanger 2 passes through a drain pan 13, which will be described later, and then is blown from the first outlet 31 and exhausted to the space to be air-conditioned or outside the room.

The branch mechanism 6 includes the air blowers and the branch chamber 63 accommodating the first fan 61 and the second fan 62 functioning as the air blowers. In FIG. 1, the first fan 61 and the second fan 62 are shown as being arranged in a side-to-side direction, but may be arranged in a front-rear direction that is perpendicular to the page of FIG. 1.

The branch mechanism 6 divides the suction channel 5 located downstream of the suction path 22 into the first channel 3 and the second channel 4, thereby dividing the suction air passing through the suction path 22 of the sensible heat exchanger 2 into first air that flows in the first channel 3 and second air that flows in the second channel 4. The suction channel 5 thus communicates with the first channel 3 and the second channel 4 via the branch chamber 63.

The first fan 61 and the second fan 62 are centrifugal fans such as turbo fans, and each have a suction portion located at its center and a blowing portion extending in one direction. The suction portion and the blowing portion are provided in a shell member that forms the outer shell of a turbo fan. The first fan 61 and the second fan 62 are provided in the branch chamber 63 so as to partially overlap each other.

The first fan 61 is disposed with the blowing portion directed toward the first channel 3. The spray unit 16 is disposed in the first channel 3, and the blowing portion of the first fan 61 is directed toward the spray unit 16. The first fan 61 blows part of suction air entering the branch mechanism 6 toward the first channel 3 as the first air. The first air blown out from the first fan 61 is guided along guide walls 32 defining the first channel 3 to the spray unit 16.

The second fan 62 is disposed with the blowing portion directed toward the second channel 4. The second channel 4 communicates with the second outlet 41, and the blowing portion of the second fan 62 is directed toward the second outlet 41. The second fan 62 blows part of suction air entering the branch mechanism 6 toward the second channel 4 as the second air. The second air blown out from the second fan 62 is supplied from the second outlet 41 to the space to be air-conditioned.

Each blowing portion of the turbo fans extends in one direction, and air blown out from each blowing portion of the turbo fans has a direction in which each blowing portion extends. The first fan 61 can efficiently blow suction air, which is sucked from the suction portion, from the blowing portion toward the spray unit 16. The second fan 62 can efficiently blow suction air, which is sucked from the suction portion, from the blowing portion toward the second outlet 41.

The first path 21 and the second path divided by the branch mechanism 6 extend in different directions so as to be opposite to each other. Similarly, the blowing portion of the first fan 61 and the blowing portion of the second fan 62 are directed in different directions so as to be opposite to each other. Accordingly, when the first air and the second air divided by the first fan 61 and the second fan 62 are blown out to the first path 21 and the second path, interference by the first air and the second air can be prevented, and generation of ventilation resistance can be reduced.

As illustrated in FIG. 1, the branch mechanism 6 is disposed above the sensible heat exchanger 2. The suction path 22 extends from down toward up in the flow direction of the suction air. Since the suction path 22 constitutes a part of the suction channel 5, the suction channel 5 extends from down toward up in the flow direction of the suction air. The first path 21 extends from up toward down in the flow direction of the first air. Since the first path 21 constitutes a part of the first channel 3, the first channel 3 extends from up toward down in the flow direction of the first air.

The branch mechanism 6 is provided at a turning point between the suction channel 5 extending from down toward up and the first channel 3 extending from up toward down. In FIG. 1, the turning point is where the channel turns about 270 degrees in the vicinity of the branch mechanism 6. In this way, the suction channel 5 extending from down toward up and the first channel 3 extending from up toward down define a U-shaped channel. The branch mechanism 6 including the air blowers is provided at the turning point in the U-shaped channel, thereby reducing the influence of the pressure loss in the U-shaped channel. Although the branch mechanism 6 disposed at the turning point above the sensible heat exchanger 2 has been described, the branch mechanism 6 disposed within the range of the turning point can contribute to reduction of pressure drop. As an example, the suction portion of the first fan 61 and the suction portion of the second fan 62 may be adjacent to the outlet of the suction path 22 in FIG. 1. In this case, a wall surface or the like may be provided to define a direction of the blowout portion of each fan in the direction of the first path 21 or in the direction of the second outlet 41, thereby easily changing a direction of air flow.

The air conditioner 1 includes, below the sensible heat exchanger 2, the drain pan 13, a tank 14 for storing spray water to be sprayed from the spray unit 16, and a pump 11 for supplying the water in the tank 14 to the spray unit 16.

The drain pan 13 is a container having an opening on an upper surface thereof, and is shaped like, for example, a dish. The drain pan 13 has a bottom surface with a communication passage for communicating with the tank 14. In the spray water sprayed from the spray unit 16, unvaporized water or water condensed after vaporization drips downward along the inner wall surface of the first path 21 of the sensible heat exchanger 2 and is held by the drain pan 13. The water in the drain pan 13 flows into the tank 14 through the communication passage.

The tank 14 is provided with a water supply port, through which tap water is to be supplied into the tank 14. The tank 14 and the pump 11 communicate with each other through a pipe, and the water in the tank 14 is supplied to the spray unit 16 by driving the pump 11.

The pump 11 is controlled to be driven or stopped by a control signal output from a controller 12. The controller 12 is comprised of a microcomputer or the like including a control unit and a storage unit, and performs control of driving or stopping of the pump 11 and the first fan 61 and the second fan 62 which are air blowers based on an operation of an operator of the air conditioner 1.

The spray unit 16 includes a spray nozzle for spraying atomized water, and the spray nozzle communicates with the tank 14 via the pipe and the pump 11. As described above, the water in the tank 14 is supplied to the spray unit 16 by the pump 11 and sprayed from the spray nozzle toward the inlet of the first path 21 of the sensible heat exchanger 2.

The air conditioner 1 includes an electric device 17 including an electric component 171 and a storage battery 172. The electric device 17 is disposed adjacent to a portion of the first channel 3 located past the first path 21 of the sensible heat exchanger 2 and the drain pan 13. In other words, the electric device 17 is disposed adjacent to the portion of the first channel 3 located between a downstream side of the drain pan 13 and the first outlet 31 in the flow direction of the first air. The positional relationship between the first channel 3 and the electric device 17 will be described in detail later.

The electric component 171 is a component, such as a resistor, a coil, a capacitor, or a semiconductor element, that generates heat when a voltage is applied and a current flows. Specifically, the electric component 171 includes a circuit board such as a control board or a power supply board on which these components are mounted. The electric component 171 may be housed in a box body such as an electrical component box. The electric component 171 may include the controller 12.

The storage battery 172 is, for example, a lithium ion battery, and supplies electric power to electric loads such as the air blowers and the pump 11 when the air conditioner 1 is not connected to a commercial power supply. The storage battery 172 supplies electric power to the electric loads, thereby generating heat due to internal resistance or the like. When the air conditioner 1 is operated using the storage battery 172 as the power supply source, the amount of heat generated by the storage battery 172 per unit time may be larger than the amount of heat generated by the electric component 171 per unit time.

Figure 3:
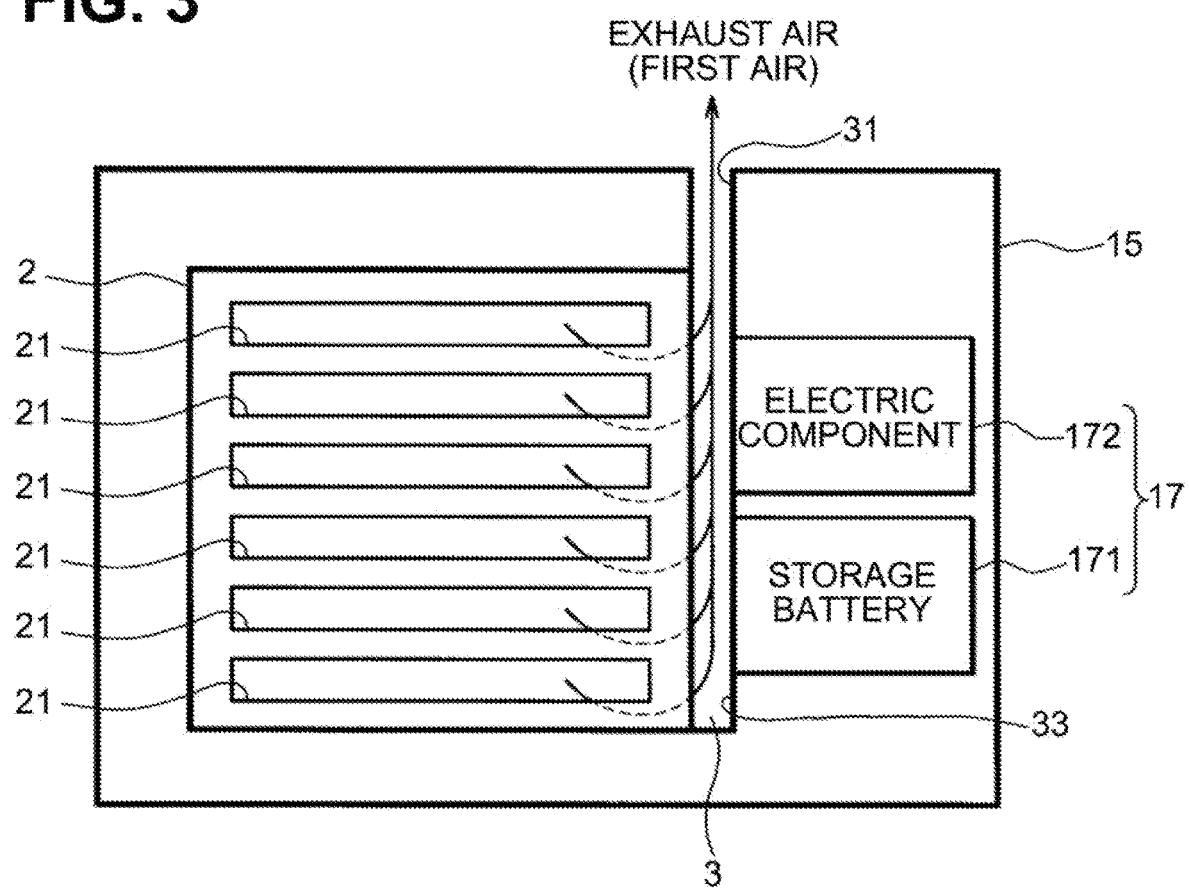
FIG. 3 is an explanatory view of a first channel downstream of a sensible heat exchanger and an electric device.

FIG. 3 illustrates the first channel 3 downstream of the sensible heat exchanger 2 and the electric device 17. FIG. 3 is a schematic cross-sectional view of the air conditioner 1 as viewed from above, and shows the positional relationship between the first channel 3 on the downstream side of the sensible heat exchanger 2 and the electric device 17 disposed adjacent to the first channel 3. FIG. 3 schematically illustrates a cross section taken along line B-B' in FIG. 2 and viewed from above in FIG. 2.

As described above, the sensible heat exchanger 2 is provided with the first paths 21 constituting a part of the first channel 3. The first paths 21 are defined by a plurality of metal plates each having, for example, a hollow structure or a plurality of flat tubes. The first air having passed through the first paths 21 of the sensible heat exchanger 2 passes through the drain pan 13 and is then blown out from the first outlet 31 provided above the drain pan 13.

As illustrated in FIG. 1, the first channel 3 located on the downstream side of the sensible heat exchanger 2 in the flow direction of the first air communicates with the drain pan 13 and the first outlet 31 in this order. The first outlet 31 is provided above the drain pan 13. The first paths 21 are formed linearly from up toward down in the flow direction of the first air. Therefore, the first channel 3 includes a turning point, as a lowest point, where the drain pan 13 is provided and the first channel 3 turns from down to up. That is, the drain pan 13 is provided at the turning point in the first channel 3.

By providing the drain pan 13 at the turning point, the atomized water flowing together with the first air flowing out of the first paths 21 can be centrifugally separated and collected in the drain pan 13. This reduces unevaporated water flowing into the first channel 3 beyond the turning point, preventing the influence of the unevaporated water on the electric device 17.

The first channel 3 from the turning point to the first outlet 31 is provided so as to extend in the depth direction in FIG. 1, that is, in the left-right direction in FIG. 2. As illustrated in FIG. 3, the electric device 17 is disposed adjacent to the first channel 3 from the turning point to the first outlet 31. The electric device 17 includes a storage battery 172 and an electric component 171. Each of the storage battery 172 and the electric component 171 is disposed adjacent to the first channel 3 and thermally connected to a wall body 33 defining the first channel 3. "One thing is thermally connected to another thing" refers to that, for example, they are connected in a heat-exchangeable manner. At this time, sensible heat is exchanged.

The wall body 33 defining the first channel 3 is a wall body 33 defining an inner surface of the first channel 3, and may be, for example, a plate-like structure member or a strength member for maintaining rigidity of the air conditioner 1. Alternatively, in a case where the first channel 3 is defined by a tubular body such as a pipe or a duct, the tubular body corresponds to the wall body 33, and the inner peripheral surface of the tubular body corresponds to the inner surface of the first channel 3.

The electric device 17, that is, each of the storage battery 172 and the electric component 171, is disposed adjacent to the wall body 33 defining the inner surface of the first channel 3 from the turning point to the first outlet 31, and is thermally connected to the wall body 33. As the storage battery 172 and the electric component 171 are thermally connected to the wall body 33, heat is exchanged between the storage battery 172 and the electrical component 171 and first air flowing through the first channel 3 defined by the wall body 33.

The operating temperature range of the storage battery 172 and the electric component 171 is, for example, 60° C. or lower. In contrast, since the temperature of the first air flowing through the first channel 3 defined by the wall body 33 is sufficiently low, the storage battery 172 and the electrical component 171 can be efficiently cooled by the first air. The temperature of the first air flowing through the first channel 3 defined by the wall body 33 is lower than the temperature of the ambient air of the air conditioner 1, that is, the room temperature of the space to be air-conditioned, because the first air is cooled by the heat of vaporization. Therefore, the storage battery 172 and the electric component 171 can be cooled more efficiently by the first air.

The temperature of the first air rises due to the heat generated by the storage battery 172 and the electric component 171, and the saturated water vapor pressure and the saturated water vapor amount of the first air rise. Although the absolute humidity of the first air increases as the water sprayed by the spray unit 16 evaporates, the saturated water vapor pressure increases and the relative humidity decreases due to the heat generated by the storage battery 172 and the electric component 171. Therefore, it is possible to reduce the occurrence of condensation in the first channel 3 located downstream of the sensible heat exchanger 2.

The first air that has passed through the sensible heat exchanger 2 is blown out from the first outlet 31 and discharged to the space to be air-conditioned or outside the room. By exchanging heat between the first air and the storage battery 172 and the electric component 171 via the wall body 33, the cold of the first air can be used to efficiently cool the storage battery 172 and the electric component 171. That is, by using the cold of the exhausted first air, a dedicated cold source for cooling the storage battery 172 and the electric component 171 can be eliminated, the electric device 17 such as the storage battery 172 and the electric component 171 can be cooled, and deterioration due to heat generation of the electric device 17 can be reduced.

The form of thermal connection between the storage battery 172 and the electric component 171 and the wall body 33 is not limited to a form in which the storage battery 172 and the electrical component 171 are in direct contact with and thermally connected to a surface of the wall body 33 facing the storage battery 172 and the electrical component 171. The storage battery 172 and the electric component 171 and the surface of the wall body 33 facing the storage battery 172 and the electrical component 171 may be thermally connected via another structural component disposed therebetween.

As illustrated in FIG. 3, the first channel 3 from the turning point to the first outlet 31 is provided between the sensible heat exchanger 2, the storage battery 172, and the electric component 171. Since the first channel 3 located downstream of the turning point in the flow direction of the first air is defined between the sensible heat exchanger 2, the storage battery 172, and the electric component 171, the first air flowing through the first channel 3 functions as a heat insulator interposed between the sensible heat exchanger 2 and the electric device 17. Therefore, it is possible to reduce the influence of heat generation of the storage battery 172 and the electric component 171 on the sensible heat exchanger 2.

The storage battery 172 and the electric component 171 are provided along the first channel 3. That is, the storage battery 172 and the electric component 171 face the wall body 33 defining the first channel 3 and are provided side by side along the flow direction of the first air flowing through the first channel 3. The storage battery 172 is provided downstream of the electric component 171 in the flow direction of the first air.

When the air conditioner 1 is operated using the storage battery 172 as the power supply source, the amount of heat generated by the storage battery 172 per unit time is larger than the amount of heat generated by the electric component 171 per unit time. When the heat generated from the storage battery 172 and the electric component 171 is transferred to the wall body 33 defining the first channel 3, the heat transfer resistance increases with a distance between the storage battery 172 and the electric component 171, which are heat generation sources, and the wall body 33, that is, a heat transfer distance. Therefore, due to the heat generated from the storage battery 172, the temperature rises the most at a portion of the wall body 33 closest to the storage battery 172. Similarly, due to the heat generated from the electric component 171, the temperature rises the most at a portion of the wall body 33 closest to the electrical component 171.

Since the storage battery 172 is located downstream of the electric component 171 in the flow direction of the first air, the first air passes through the portion of the wall body 33 closest to the electrical component 171 and then passes through the portion of the wall body 33 closest to the storage battery 172. Therefore, the electric device 17 including the storage battery 172 and the electric component 171 can be efficiently cooled with the first air by first cooling the electric component 171 having a small heat generation amount and then cooling the storage battery 172 having a larger heat generation amount than the electric component 171. Since the amount of heat generated by the electric component 171 is small, the influence on cooling of the electric component 171 is small. As the electric component 171 having a small amount of heat generation is disposed on the upstream side of the storage battery 172 having a large amount of heat generation to be cooled with the first air in this manner, a large temperature difference from the first air can be obtained in both the electric component 171 and the storage battery 172, and efficient cooling can be achieved. The storage battery 172 is a consumable component that needs to be replaced depending on a period of use, whereas the electric component 171 is mounted on the air conditioner 1 as a so-called permanent component. Therefore, by disposing the electric component 171 upstream of the storage battery 172, the electric component 171 can be cooled prior to the storage battery 172, which is a consumable component, and deterioration of the electric component 171 due to heat can be reduced.

In the disclosure, the electric component 171 having a small heat generation amount is disposed upstream of the storage battery 172 having a large heat generation amount in the flow direction of the first air and is cooled by the first air. However, the disclosure is not limited to this. The electric component 171 that generates a small amount of heat may be disposed downstream of the storage battery 172 that generates a large amount of heat in the flow direction of the first air. By disposing the storage battery 172 having a large amount of heat generation upstream of the electric component 171 having a small amount of heat generation, the storage battery 172 having a large amount of heat generation can be preferentially cooled, and deterioration of the storage battery 172 due to heat can be suppressed.

Figure 4:
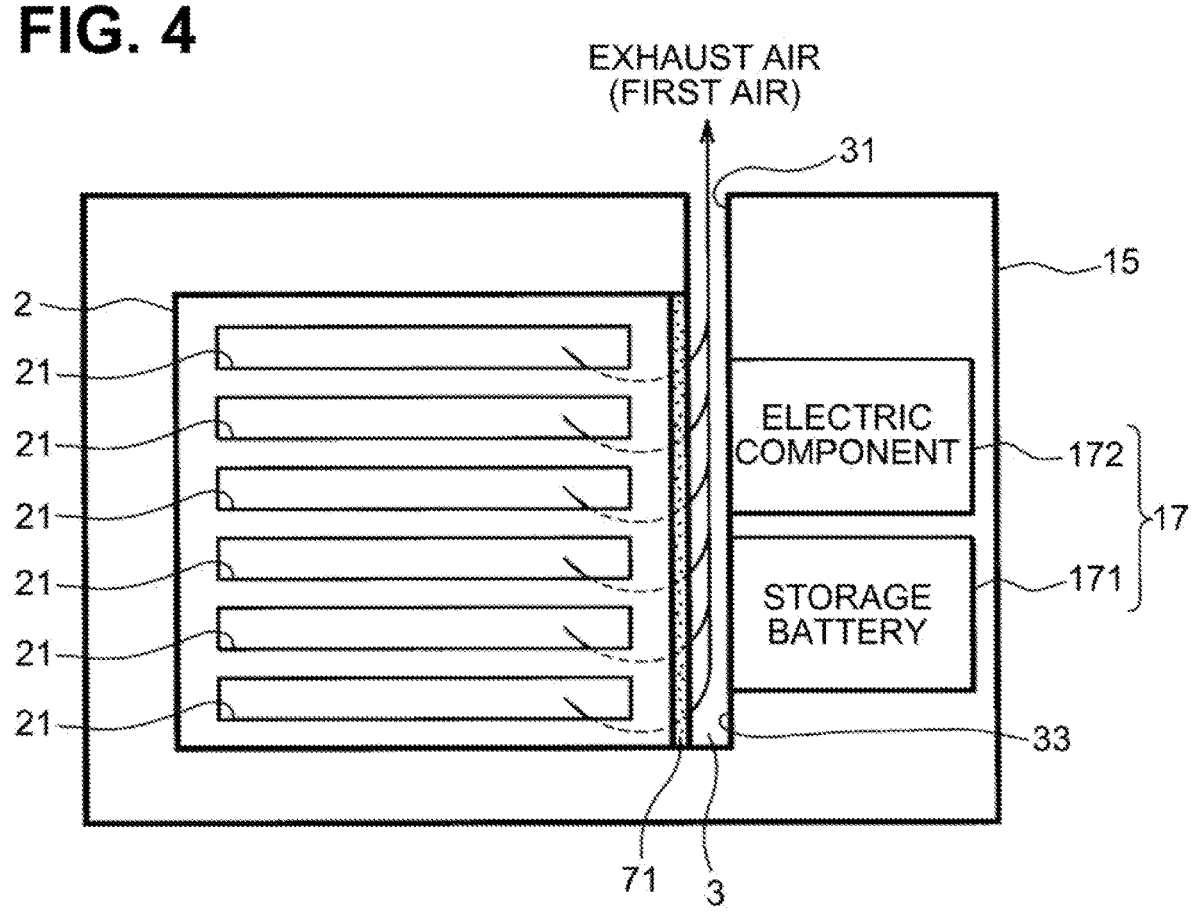
FIG. 4 is an explanatory view of a first channel and an electric device according to a second embodiment.

FIG. 4 is an explanatory view of the first channel 3 and the electric device 17 according to the second embodiment. FIG. 4 is an explanatory view particularly relating to a heat transfer reducing member 71 adjacent to the sensible heat exchanger 2. The air conditioner 1 according to the second embodiment is different from the air conditioner 1 of the first embodiment in that a heat transfer reducing member 71 for reducing heat transfer is disposed between the first channel 3 located downstream of the sensible heat exchanger 2 and the sensible heat exchanger 2.

The heat transfer reducing member 71 is disposed between the sensible heat exchanger 2 and the first channel 3 located downstream of the turning point. That is, in the wall body 33 defining the first channel 3, the heat transfer reducing member 71 is interposed between the sensible heat exchanger 2 and a portion of the wall body 33 adjacent to the sensible heat exchanger 2. The heat transfer reducing member 71 is, for example, a heat insulator such as foamed plastic. Alternatively, a heat transfer reducing structure in which a partitioned air layer is provided may be used.

By disposing the heat transfer reducing member 71 between the sensible heat exchanger 2 and first channel 3 located downstream of the sensible heat exchanger 2, the influence of the heat generated by the electric device 17 on the sensible heat exchanger 2 can be reduced. In other words, it is possible to reduce the influence of the heat generated by the electric device 17 on the temperature of the second air supplied to the space to be air-conditioned.

Figure 5:
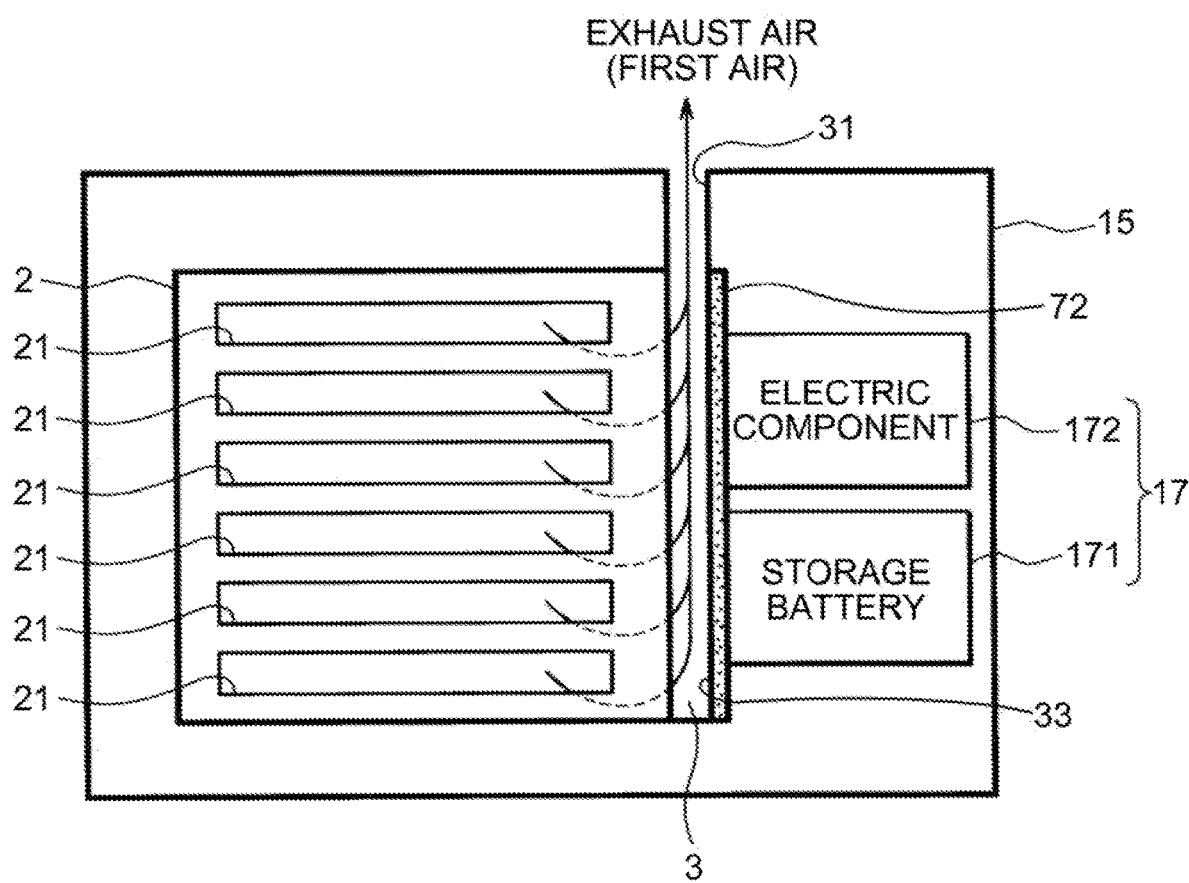
FIG. 5 is an explanatory view of a first channel and an electric device according to a third embodiment.

FIG. 5 is an explanatory view of the first channel 3 and the electric device 17 according to a third embodiment. FIG. 5 is an explanatory view particularly relating to a heat transfer promoting member 72 adjacent to the electric device 17. The air conditioner 1 according to the second embodiment is different from the air conditioner 1 of the first embodiment in that a heat transfer promoting member 72 configured to promote heat transfer is disposed between the electric device 17 and the first channel 3 located downstream of the sensible heat exchanger 2.

The heat transfer promoting member 72 that promotes heat transfer is disposed between the first channel 3 located downstream of the turning point, and the storage battery 172 and the electric component 171. That is, in the wall body 33 defining the first channel 3, the heat transfer promoting member 72 is interposed between a portion of the wall body 33 adjacent to the storage battery 172 and the electric component 171, and the storage battery 172 and the electric component 171. The heat transfer promoting member 72 is a metal heat sink having good heat conductivity and including, for example, aluminum, copper, or an alloy containing aluminum and copper as main ingredients. In addition, the heat transfer promoting member 72 may protrude from the wall body 33 toward the first channel 3, or may have an uneven surface so that a large heat exchange area is ensured. Further, the wall body 33 and the heat transfer promoting member 72 may be integrated. That is, various materials and structures for increasing the heat exchange efficiency can be adopted for the heat transfer promoting member 72, and the heat transfer promoting member 72 may be considered to be a part of the wall body 33.

By disposing the heat transfer promoting member 72 between the first channel 3 located downstream of the sensible heat exchanger 2, and the storage battery 172 and the electric component 171, the storage battery 172 and the electric component 171 can be efficiently cooled by the first air flowing through the first channel 3.

It is to be understood that the embodiments disclosed herein are illustrative in all respects and are not restrictive. The scope of the disclosure is defined not by the above-described meaning but by the claims, and is intended to include all modifications within the meaning and scope equivalent to the claims.

What is claimed is:

1. An air conditioner comprises:
an inlet;
a suction channel through which air sucked from the inlet flows;
a spray unit configured to spray water to be vaporized;
a first channel through which first air to be cooled by heat of vaporization of water sprayed from the spray unit flows;
a heat exchanger configured to exchange heat between the first air and the air flowing through the suction channel to cool the air flowing through the suction channel;

a wall body defining the first channel located downstream of the heat exchanger in a flow direction of the first air; and an electric device configured to generate heat with power consumption by the air conditioner, wherein the electric device is thermally connected to the wall body, located outside the first channel, and cooled through the wall body.

2. The air conditioner according to claim 1, wherein at least a portion of the first channel located downstream of the heat exchanger in the flow direction of the first air is defined between the heat exchanger and the electric device.

3. The air conditioner according to claim 2, further comprising a heat transfer reducing member disposed between the heat exchanger and the at least a portion of the first channel located downstream of the heat exchanger in the flow direction of the first air.

4. The air conditioner according to claim 1, wherein the wall body includes a heat transfer promoting member configured to promote heat transfer.

5. The air conditioner according to claim 1, wherein the first channel located downstream of the heat exchanger includes a turning point at which the first channel turns from down to up, and wherein the electric device is thermally connected to the wall body defining the first channel located downstream of the turning point in the flow direction of the first air.

6. The air conditioner according to claim 5, wherein a drain pan is disposed at the turning point to collect water dripping from the heat exchanger.

7. The air conditioner according to claim 1, wherein the electric device includes a storage battery configured to supply power to the air conditioner.

8. The air conditioner according to claim 7, wherein the electric device includes an electric component having a heat generation amount less than that of the storage battery, wherein the storage battery and the electric component are disposed along the first channel located downstream of the heat exchanger, and wherein the storage battery is disposed downstream of the electric component in the flow direction of the first air.

* * * * *